(12) United States Patent
Bodin

(10) Patent No.: US 6,174,231 B1
(45) Date of Patent: Jan. 16, 2001

(54) AIR OUTLET DEVICE FOR A MICROCOMPUTER CPU

(76) Inventor: Eric Jean-Louis Bodin, 18 Allée des Castillons B.P. 13, 14201 Herouville, Cedex (FR)

( * ) Notice: Under 35 U.S.C. 154(b), the term of this patent shall be extended for 0 days.

(21) Appl. No.: 09/147,379

(22) PCT Filed: Jun. 11, 1997

(86) PCT No.: PCT/FR97/01040

§ 371 Date: Dec. 11, 1998

§ 102(e) Date: Dec. 11, 1998

(87) PCT Pub. No.: WO97/48036

PCT Pub. Date: Dec. 18, 1997

(30) Foreign Application Priority Data

Jun. 11, 1996 (FR) .................................................. 96 07222

(51) Int. Cl.⁷ .................................................. H05K 5/00
(52) U.S. Cl. .................. 454/184; 55/385.6; 454/286; 454/306
(58) Field of Search .................. 454/184, 367, 454/354, 355, 286, 305, 306; 361/678, 695; 220/371, DIG. 27; 55/385.6, 467, 473, 493, 502; 174/16.1

(56) References Cited

U.S. PATENT DOCUMENTS

| | | | |
|---|---|---|---|
| 791,397 | * | 5/1905 | Asbury .................................. 454/306 |
| 2,735,964 | * | 2/1956 | Grieve et al. . |
| 3,018,711 | * | 1/1962 | Welch et al. .......................... 454/154 |
| 3,892,169 | * | 7/1975 | Jarnot . |
| 5,193,523 | * | 3/1993 | Denber .................................. 126/204 |
| 5,573,562 | * | 11/1996 | Schauwecker et al. .......... 454/184 X |
| 5,730,770 | * | 3/1998 | Greisz .................................. 55/385.6 |

FOREIGN PATENT DOCUMENTS 41 11 333  * 10/1992 (DE) .
379604     *  7/1940 (IT) ...................................... 454/286

OTHER PUBLICATIONS

*Patents Abstracts of Japan*, 06/021674, vol. 018, No. 230, Nec Corp., Jan. 1994.*
*Patents Abstracts of Japan*, 03/012107, vol. 015, No. 128, Sanwa Ginkou et al., Mar. 1991.*
Duvorack, Paul J., "Packaging Computers to Survive in the Real World", *Machine Design*, vol. 60, No. 12, May 1988, Cleveland, Ohio, pp. 70–76.*

* cited by examiner

*Primary Examiner*—Harold Joyce
(74) *Attorney, Agent, or Firm*—Armstrong, Westerman, Hattori, McLeland & Naughton

(57) ABSTRACT

Air exit device of a microcomputer central unit, characterized by the fact that it comprises a support (3) to be fixed around the microcomputer housing ventilation air exit opening (2), an orientable guide tube (4, 4A, 4B) linked to the support (3), and a removable air filter (5, 6) placed in the way of the air which passes through the support (3) and the guide tube (4, 4A, 4B).

7 Claims, 2 Drawing Sheets

AIR OUTLET DEVICE FOR A MICROCOMPUTER CPU

Figure 1:
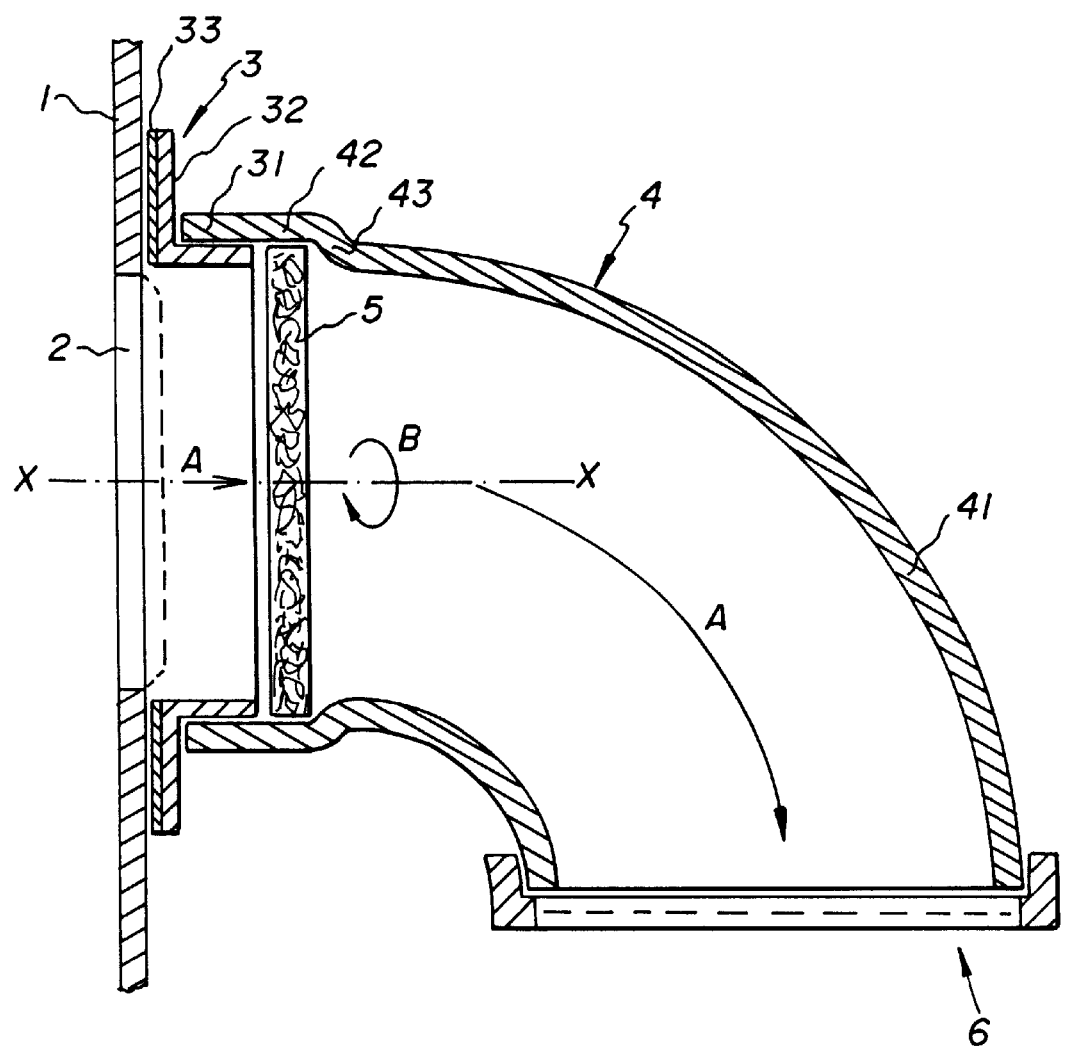

The present invention concerns an air exit device of a microcomputer central unit.

Microcomputer ventilation air exits, especially if the microcomputers are used in a great number, are a nuisance for the people placed in front of the air exits, e.g. if many microcomputers are grouped.

The great quantities of air put into circulation by the microcomputer ventilation also represent a pollution source not to be neglected because this air sweeps dust and germs around. There are makeshift solutions consisting in fixing a piece of paper with an adhesive strip in front of the air exit in order to form a deflector lifted by the air blow. This solution, however, is not satisfactory, because it does not allow to direct the air and in any case does not clean the air flow charged with dust and particles.

The present invention has the scope to remedy these disadvantages and for this purpose concerns an air exit device of a microcomputer central unit, characterized by the fact that it comprises:

a support to be fixed around the microcomputer housing ventilation air exit opening,
an orientable guide tube linked to the support
a removable air filter placed in the way of the air which passes through the support and the guide tube.

This device allows to orient the ventilation air stream in the desired direction; this orientation can be modified according to circumstances.

The removable air filter holds back the dust, particles etc. It can be replaced by simply taking it out, and it can be sold as an accessory. The installation of the device is easy and not definitive. The support is to be fixed in an impermeable way around the exit opening, generally circular, of the microcomputer housing. At that moment it is not necessary to consider the orientation one wants to give to the guide tube because the latter is orientable.

This air exit device also has the advantage of not interfering with the production of the housing or that of the other parts of the microcomputer. The sufficient porosity of the air filter allows a good ventilation of the microcomputer.

According to further advantageous characteristics of the invention:

the support is formed by a sleeve equipped with a circular flange which carries an adhesive in order to glue the support to the housing wall around the ventilation air exit opening.
the support is formed by an adhesive ring equipped with a hooking surface, this ring being fixed on the housing around the air exit opening and the guide tube is equipped with a peripheric flange equipped with a complementary hooking surface to be fixed on the hooking surface of the support.
the guide tube is formed by an elbow helved on the sleeve of the support.
the guide tube is equipped with a peripheric flange endowed with a hooking surface in order to represent the support fixed directly on the housing around the ventilation air exit opening.
the guide tube has a circular section at the level of the ventilation air exit opening and downstream of this opening its section is circular, flat oval or rectangular.
the removable filter consists of a seal obtained on the exit of the microcomputer housing by the support.
the air filter is a seal held between the support and the sleeve of the tube.
the air filter is an element fixed at the exit of the air guide tube.
the air guide tube is composed of a part equipped with a sleeve fixed on the sleeve of the support and of a part telescopically helved on the part.

Figure 2:
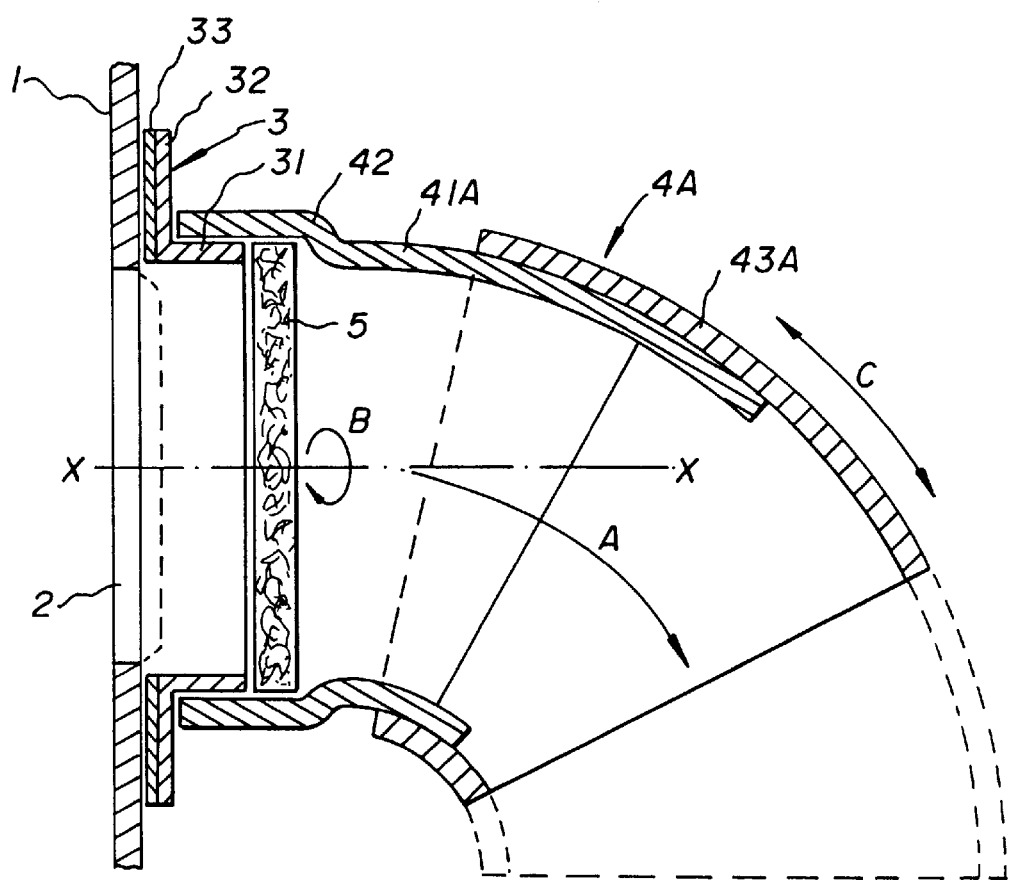
Figure 3:
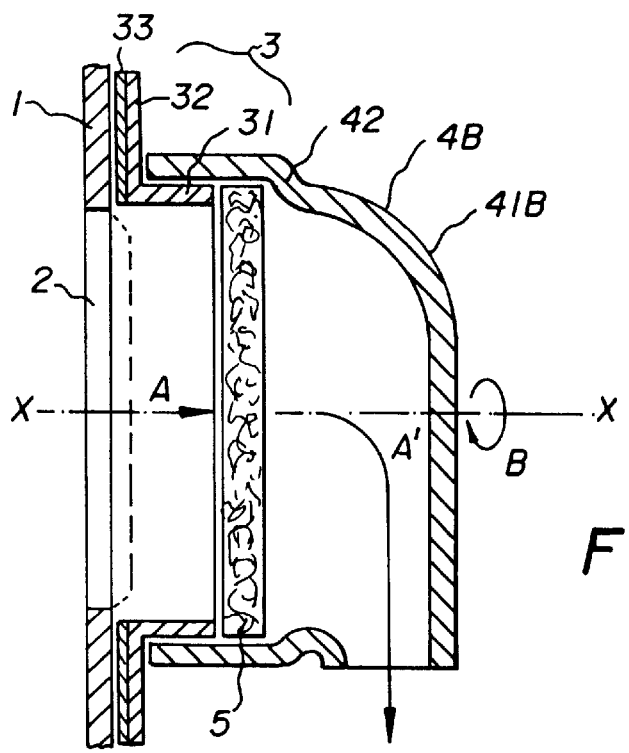

The present invention is described more in detail in the following with the help of various execution examples schematically illustrated in the enclosed drawings in which:

FIG. 1 is a partial section view of the wall of the microcomputer housing at the level of the ventilation air exit, this wall being equipped with an air exit device according to a first way of execution of the invention, FIG. 2 is a section view analogous to that of FIG. 1 corresponding to a second way of execution of the invention, FIG. 3 is a section view analogous to that of FIG. 1 corresponding to a third way of execution of the invention.

According to FIG. 1, the invention concerns an air exit device to be fixed on the wall 1 of the housing of a microcomputer central unit, around the microcomputer ventilation air exit opening 2. The air circulation is represented by the arrows A.

The device is composed of a support 3 to be fixed in an impermeable way around the opening 2. As the opening 2 is generally of a circular form, the support 3 is, according to this way of execution, a sleeve-shaped piece 31 surrounded by a peripheral flange 32 equipped with a fixing means 33, e.g. a double-face glue which is to be glued on the one hand to the flange 32 and on the other hand to the wall 1. This fixing means may also consist of a hooking means with claws, formed by two parts of which one is glued to the wall 1 and the other to the flange 3. A seal not illustrated here, e.g. inside the sleeve, like a foam seal, ensures impermeability.

The support, on its sleeve 31, receives a guide tube 4 formed by an elbow 41 ending at one of its ends in a sleeve 42 destined to slide on the sleeve 31 of the support 3. The link between the parts 42, 31 is a simple helving, allowing to direct the air exit by rotation of the guide tube around the axis XX (rotation axis) in the direction of the double arrow B. In this way the guide tube can be oriented between the descending vertical position shown in FIG. 1 and any other orientation around the axis XX.

Between the shoulder 43 formed by the junction of the parts 41 and 42 of the guide tube 4 and the sleeve 31 of the support 3, a washer-shaped filter 5 is placed. This filter has a porosity which is sufficiently fine for retaining dust and particles, and it causes a relatively feeble charge loss so that it does not significantly obstruct the ventilation air exit.

This filter 5 is mounted in a replaceable way. To replace it, it suffices to draw out the guide tube 4.

It is also possible to foresee a filter 6 at the exit of the elbow 41 of the guide tube 4. This filter 6 is then simply helved or eventually screwed onto the end of the end 41.

The accessibility to the filter is easily assured 20 in both cases. In the first case, the filter is mechanically protected inside the sleeve, the filter is taken out simply by extracting the sleeve.

Moreover, in this case the air flow is again regularized by the sleeve downstream the filter.

In the second case the filter is directly accessible without having to take away the sleeve, but the air outflow is more diffuse and less directed.

In both cases the changed filter is replaced like all "consumable" accessories.

This second variant constitutes an alternative to the first variant, i.e. to the filter 5. One can also, if necessary, provide a double filter, but limiting the admitted maximum for the charge losses in order not to disturb the ventilation air circulation.

This filter, e.g. made of unwoven fibres, can be charged with a product which favours particle retention, with a disinfectant or a perfume.

In the case of two filters, one of them may be an activated charcoal filter.

FIG. 2 shows another execution variant of an air exit device. For the description of this figure the same references as in FIG. 1 have been used to refer to common parts.

According to this second execution variant, the air exit device is fixed as before on the wall 1 of a housing of a microcomputer central unit around the ventilation air exit opening 2. This opening is usually equipped with a grate. The air circulates in direction of the arrow A.

The device consists, as before, of a support 3 fixed around the opening 3. The support is composed of a sleeve 31 and a peripheral collar 32. This peripheral collar 32 is fixed to the wall 1 in a removable way by a fixing means like a double-faced adhesive band or a hooking means with claws.

The support 3 receives the guide tube 4A formed by an elbow-shaped sleeve 41 ending at one of its ends in a sleeve 42 which engages over the sleeve 31 of the support 3 with eventual interposition of the washer of the air filter 5.

The elbow 41A receives in a sliding way an elbow 25 of exit 43A which can slide on the elbow 41A in the direction of the double arrow C in order to modify the direction of the air exit jet. So this modification of the outflow direction is combined with the angular orientation around the axis XX (arrow B) as in the first way of execution.

This external elbow 43A can also receive at its end a joining piece with filter like the filter 6 of FIG. 1.

According to FIG. 3, the third way of execution of the air exit device according to the invention differs from the first way of execution of FIG. 1 exclusively by a modification of the shape of the elbow 41B which is flattened in order to occupy less space, through having an identical section in order not to change the air circulation speed (arrow A') too much. The other parts of this air exit device are identical with those of the first way of execution and their description is not repeated.

Like in the first way of execution, one can equally foresee a filter (not shown) at the exit of the sleeve 41B. This filter will have a section adapted to that of the elbow 41B of the guide tube 4B which has been modified in this way.

What is claimed is:

1. An air exit device for a microcomputer center unit, comprising a removable air filter placed in the way of the air which exits through the microcomputer ventilation air opening, a support to be fixed around the microcomputer housing ventilation air exit opening, said support comprising a hooking surface, and an orientable guide tube liked to the support, said guide tube being equipped with a complementary hooking surface fixed on the hooking surface of the support, wherein the removable air filter is held between the support and the guide tube.

2. A device according to claim 1, wherein the support comprises an adhesive ring, the ring being fixed on the housing around the air exit opening.

3. A device according to claim 1, wherein the guide tube comprises an elbow.

4. A device according to claim 1, wherein the guide tube has a circular section at the level of the ventilation air exit opening and downstream of this opening is circular, flat oval or rectangular section.

5. A device according to claim 1, wherein the removable filter consists of a seal.

6. A device according to claim 1, wherein the air guide tube comprises a first part and of a second part telescopically helved on the first part.

7. A device according to claim 1, wherein the air guide tube is equipped with a sleeve helved on a sleeve of the support.

* * * * *